United States Patent
Baker

(10) Patent No.: US 7,151,698 B2
(45) Date of Patent: Dec. 19, 2006

(54) INTEGRATED CHARGE SENSING SCHEME FOR RESISTIVE MEMORIES

(75) Inventor: R. Jacob Baker, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/106,716

(22) Filed: Apr. 15, 2005

(65) Prior Publication Data

US 2006/0062062 A1 Mar. 23, 2006

Related U.S. Application Data

(60) Continuation of application No. 10/918,382, filed on Aug. 16, 2004, now Pat. No. 6,901,020, which is a division of application No. 10/445,940, filed on May 28, 2003, now Pat. No. 6,870,784.

(51) Int. Cl.
*G11C 8/00* (2006.01)
(52) U.S. Cl. .................... 365/189.01; 365/233
(58) Field of Classification Search ........... 365/189.01, 365/233
See application file for complete search history.

(56) References Cited

U.S. PATENT DOCUMENTS

| | | | |
|---|---|---|---|
| 5,953,276 A | 9/1999 | Baker | |
| 6,259,644 B1 | 7/2001 | Tran et al. | |
| 6,282,133 B1 * | 8/2001 | Nakagawa et al. | ......... 365/194 |
| 6,584,589 B1 * | 6/2003 | Perner et al. | ................ 365/201 |
| 6,674,679 B1 | 1/2004 | Perner et al. | |
| 2002/0008987 A1 | 1/2002 | Koichi et al. | |

FOREIGN PATENT DOCUMENTS

| | | |
|---|---|---|
| EP | 1 152 429 A | 11/2001 |
| GB | 1379856 A | 1/1975 |
| WO | WO 03/067238 A | 8/2003 |

* cited by examiner

*Primary Examiner*—Thong Q. Le
(74) *Attorney, Agent, or Firm*—Dickstein Shapiro LLP

(57) ABSTRACT

An integrated charge sensing scheme for sensing the resistance of a resistive memory element is described. The current through a resistive memory cell is used to charge a capacitor coupled to a digit line. The voltage on the capacitor, which corresponds to the voltage on the digit line, is applied to one input of a comparator. When the voltage on the bit line exceeds a predetermined fixed voltage applied to the second input to the comparator less an offset, the comparator switches logic state, charge is drawn off from the capacitor and the capacitor charges again. The process of charging and discharging the capacitor occurs during a predetermined time period and the number of times the capacitor switches during the time period represents the resistance of the memory element.

3 Claims, 4 Drawing Sheets

INTEGRATED CHARGE SENSING SCHEME FOR RESISTIVE MEMORIES

This application is a continuation of application Ser. No. 10/918,382, filed Aug. 16, 2004, now U.S. Pat. No. 6,901,020 which is a divisional of application Ser. No. 10/445,940, filed May 28, 2003, now U.S. Pat. No. 6,870,784 the subject matter of each are incorporated by reference herein.

FIELD OF THE INVENTION

The present invention relates to memory devices, and more specifically to an integrated charge sensing scheme for resistive memories.

BACKGROUND OF THE INVENTION

Digital memories are widely used in computers, computer system components and computer processing systems. Resistive memories store digital information in the form of bits or binary digits as "0"s or "1"s based on the resistance of a memory element or cell.

Resistive memory devices are configured in arrays where a resistive element or cell is at the intersection of a row line (word line) and a column line (digit line or bit line). In order to read or sense the state of a memory cell, it is necessary to first select the desired memory cell by selecting the column line and row line, which intersect at the desired memory element. Once the desired memory element is isolated, the selected memory cell is then read by applying a read voltage to the cell.

SUMMARY OF THE INVENTION

The present invention is directed towards an integrated charge sensing scheme for sensing the resistance of a resistive memory element. In accordance with an embodiment of the present invention, leakage current through the resistive memory element is used to charge a capacitor coupled to the digit or bit line. The voltage on the capacitor, which corresponds to the voltage on the digit line, is applied to a first input of a clocked comparator. When the voltage on the digit line exceeds a predetermined value (determined by a fixed voltage applied to a second input to the comparator and an offset built-into the comparator), and when a leading edge of a clock signal is received, the comparator switches to a high state and the charge is then drawn off from the capacitor until the voltage at the first input falls below that at the second input or a falling edge of the clock signal occurs. At that time, the comparator switches to a low state and voltage on the capacitor begins to build again. If on the next clock leading edge the voltage at the first input again exceeds that at the second input, the comparator again goes to a high state. If instead, the voltage on the first input is less than that of the second input, the clocked comparator continues its low output. The number of times that the clocked comparator switches to a high state over a fixed period of time can be counted to provide an indication of the leakage current, and thus the resistance, of the memory element.

BRIEF DESCRIPTION OF THE DRAWINGS

Other features and advantages of the present invention will become apparent when the following description is read in conjunction with the accompanying drawings, in which.

DETAILED DESCRIPTION OF THE PREFERRED EMBODIMENTS

Figure 1:
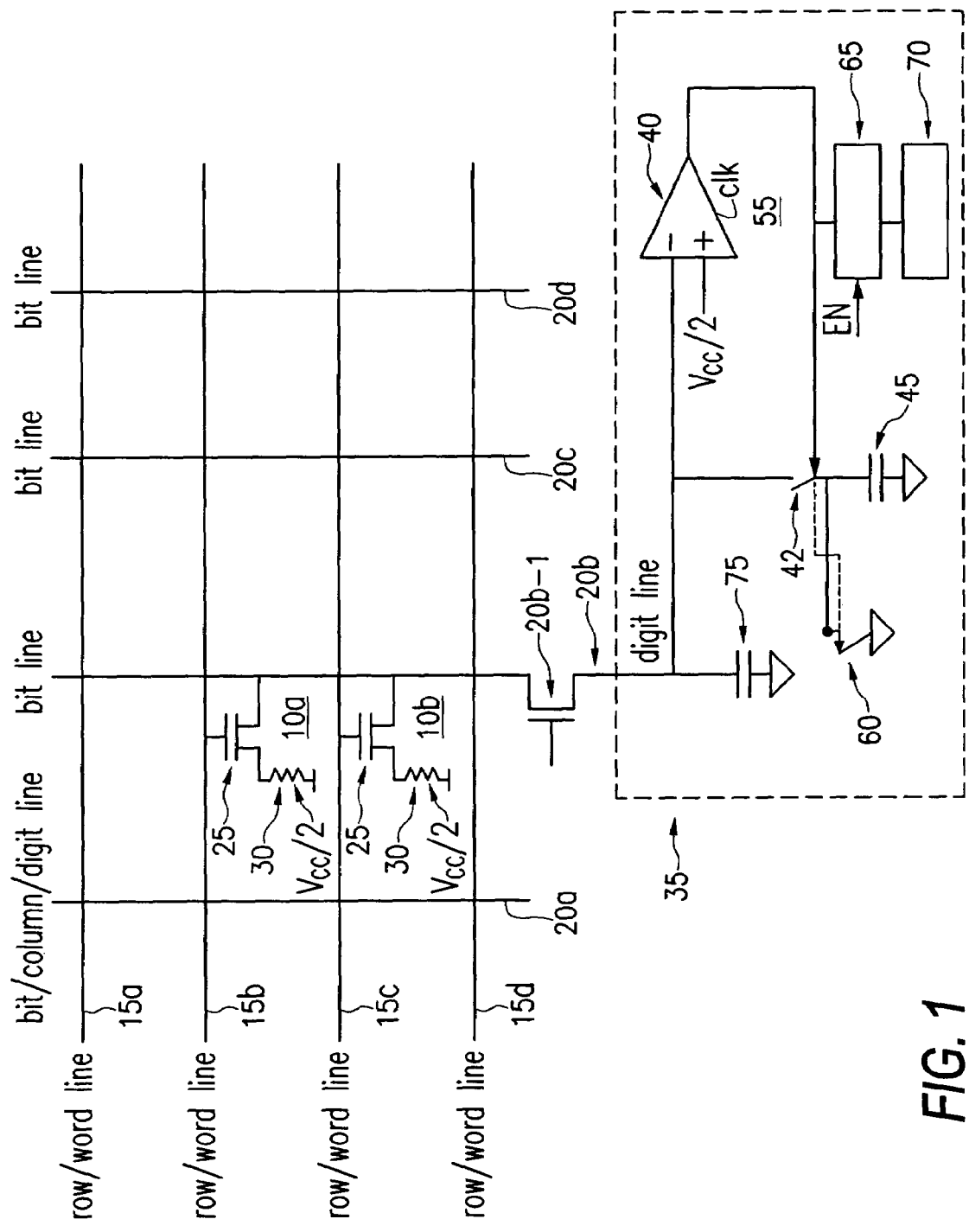
FIG. 1 is schematic diagram illustrating the integrated charge sensing circuit of an embodiment of the present invention coupled to an array of resistive memory cells.

FIG. 1 shows the integrated charge sensing circuit of an embodiment of the present invention coupled to an array of resistive memory cells arranged at the intersection of column lines (digit lines) and row lines (word lines). Two exemplary memory cells 10a and 10b are shown. Memory cell 10a is addressed by row line 15b and digit line 20b. Memory cell 10b is addressed by row line 15c and digit line 20b. Memory cells 10a and 10b each include an access transistor 25 and a programmable resistance element 30 coupled to a voltage source of Vcc/2. In the following discussion, the circuit of the present invention is described with reference to exemplary memory cell 10a. Although the invention is described below with respect to a resistive memory cell, e.g., resistive element 30 which is accessed with an access transistor 25, the invention can also be adapted to work with other techniques for accessing the memory cell as long as current through a selected memory element is supplied to capacitor 75.

In accordance with the present invention, digit lines 20a, 20b, 20c and 20d are each connected to a respective integrated charge sensing circuit 35 such as the one shown connected to digit line 20b through respective column select transistors such as 20b-1. Measurement circuit 35 is formed of a feedback loop including a clocked comparator 40 for measuring the current leaked through memory cell 10a, which is stored on a digit line capacitor 75. Capacitor 75 is coupled to a first input of comparator 40. Comparator 40 is provided with an internal offset voltage, $V_{os}$ at its second input, which also receives a reference voltage $V_{cc}/2$. In accordance with the operation of the circuit of the present invention, comparator 40 makes a comparison each time clock signal $\Phi_1$ (shown in FIG. 3) goes high. At that time comparator 40 makes a comparison between the voltage on digit line 20b and the reference input $(V_{CC}/2)-V_{os}$. When the voltage on digit line 20b exceeds $(V_{CC}/2)-V_{os}$, the output of clocked comparator 40 switches high. The high output of comparator 40 closes switch 42 and causes the charge stored on digit line capacitor 75 to be drawn off/transferred onto another capacitor 45. The high output of comparator 40 also opens switch 60. When the voltage on the digit line falls below $(V_{CC}/2)-V_{os}$, or clock signal $\Phi_1$ goes low, the comparator 40 output goes low, opening switch 42 and closing switch 60 to draw any charge on capacitor 45 to ground. Each time clock signal $\Phi_1$ goes high, another comparison is made. If, at the time of the comparison, the voltage on capacitor 75 is lower than that at the second input of comparator 40 then the output of comparator 40 remains low. The process of discharging and recharging capacitor 75 continues for a predetermined period of time. During this predetermined period of time a counter 65 is enabled and counts all low to high transitions of comparator 40. The number of times comparator transitions from low to high during the predetermined time period is representative of a resistance of the memory element 30 or cell 10a.

It is noted that digit lines have parasitic capacitance and can be charged by the current conducted through the memory cells and accordingly capacitor 75 may be a discrete capacitor, a parasitic capacitance of the digit line or a combination of the two. It is also noted that $V_{CC}/2$ at the memory cell and at the comparator are physically tied together. As noted, switch 60 is operated when the output of comparator 40 goes low to draw charge on capacitor 45 to ground, thereby enabling capacitor 45 to again draw charge from capacitor 75 when switch 42 is closed. In an alternative embodiment, switch 60 may be operated by a complementary non-overlapping clock $\Phi_2$ (shown in FIG. 3) to clock signal $\Phi_1$ (shown in FIG. 3) being read.

The charging and discharging of capacitor 75 and selective discharging of capacitor 45 is implemented with switches 42 and 60 which, as shown in FIG. 1, act together to either connect capacitor 45 to the digit line or alternatively to ground depending upon the output state of comparator 40 or the state of non-overlapping clock signal $\Phi_2$ if used to control switch 60. Those skilled in the art will appreciate, with the benefit of the present description, that the switching function can be implemented in numerous different circuits using, for example, transistors for switches 42 and 60, and is not limited to the two switches illustrated.

The circuit of the present invention further includes the counter 65, controlled by an enable "EN" signal during the read period, that counts the number of times N that comparator 40 goes low to high in a predetermined period of time. The count N is inversely proportional to the current and thus the resistance of the memory cell 10a.

A digital value comparison is performed on the value N stored in counter 65 by a digital value comparison device 70 to determine at the end of the predetermined read period if the value N, and thus the resistance of memory cell 10a is above or below a threshold value to determine if the resistance is above or below a predetermined value to indicate a logic one or a logic zero state.

In an exemplary embodiment of the present invention, the digital value comparison device could operate to evaluate the count N in the following manner. A high resistance value and a low resistance value of the resistive memory cell are known in a gross sense. Thus, for example, a high resistance value might be represented by a count (N value) of 10 and a low resistance value might be represented by a count of 20. Accordingly, a threshold value of 15 can be used by comparison device 70 to determine the logic state of the sensed memory cell.

Figure 2:
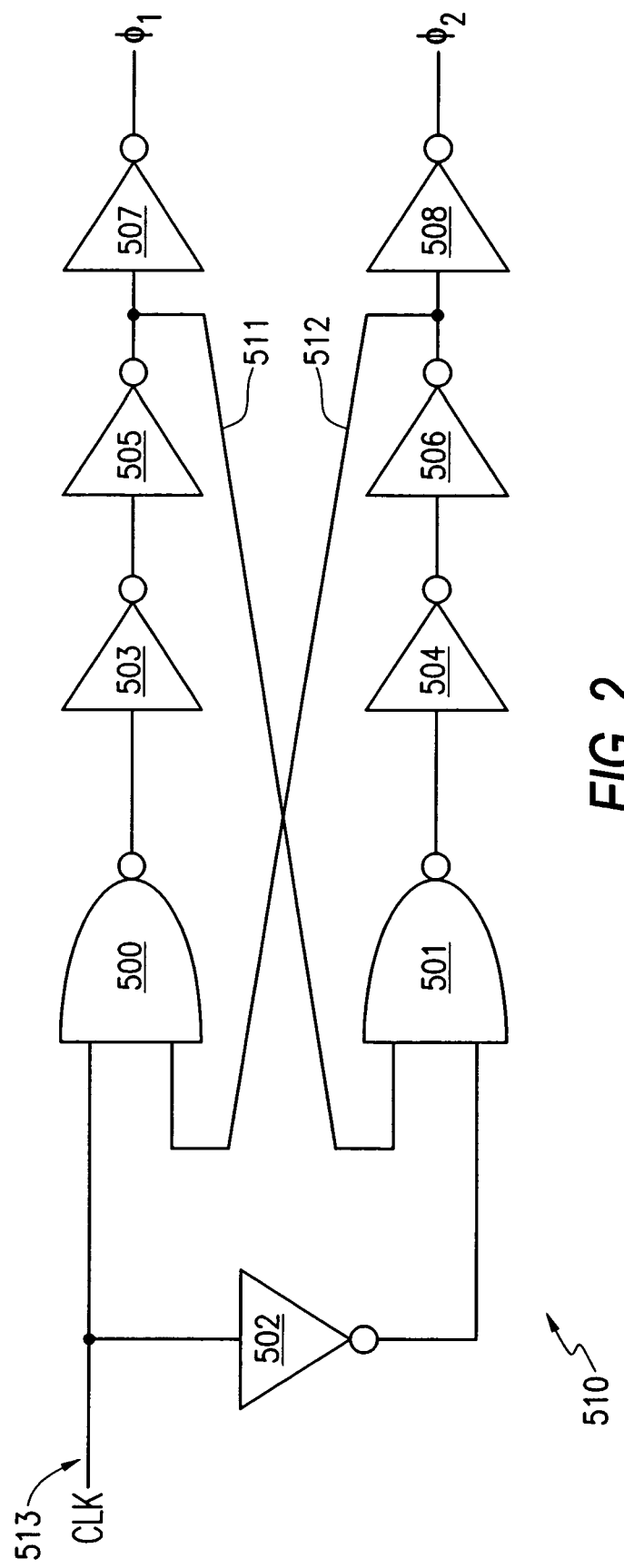
FIG. 2 is an exemplary block diagram of a non-overlapping clock generation circuit used in the present invention.

FIG. 2 is an exemplary block diagram of a non-overlapping clock generator which may be used in the present invention to produce $\Phi_1$ and $\Phi_2$ clock signals, which are complementary and non-overlapping clock signals.

The oscillator clock output 513 is coupled to one terminal of NAND gate 500. The oscillator clock output signal 513 is also inverted via logic inverter 502 and connected to one terminal of NAND gate 501. The outputs of NAND gates 500 and 501 are each dually inverted via inverters 503, 505 and 504, 506, respectively. The outputs 511 and 512 of the dual inverters (503, 505 and 504, 506) are each coupled to a respective inverter 507 and 508, and are also fed back respectively to a second terminal of NAND gates 501 and 500. Inverters 507 and 508 respectively output non-overlapping signals $\Phi_1$ and $\Phi_2$ (shown in FIG. 3).

Figure 3:
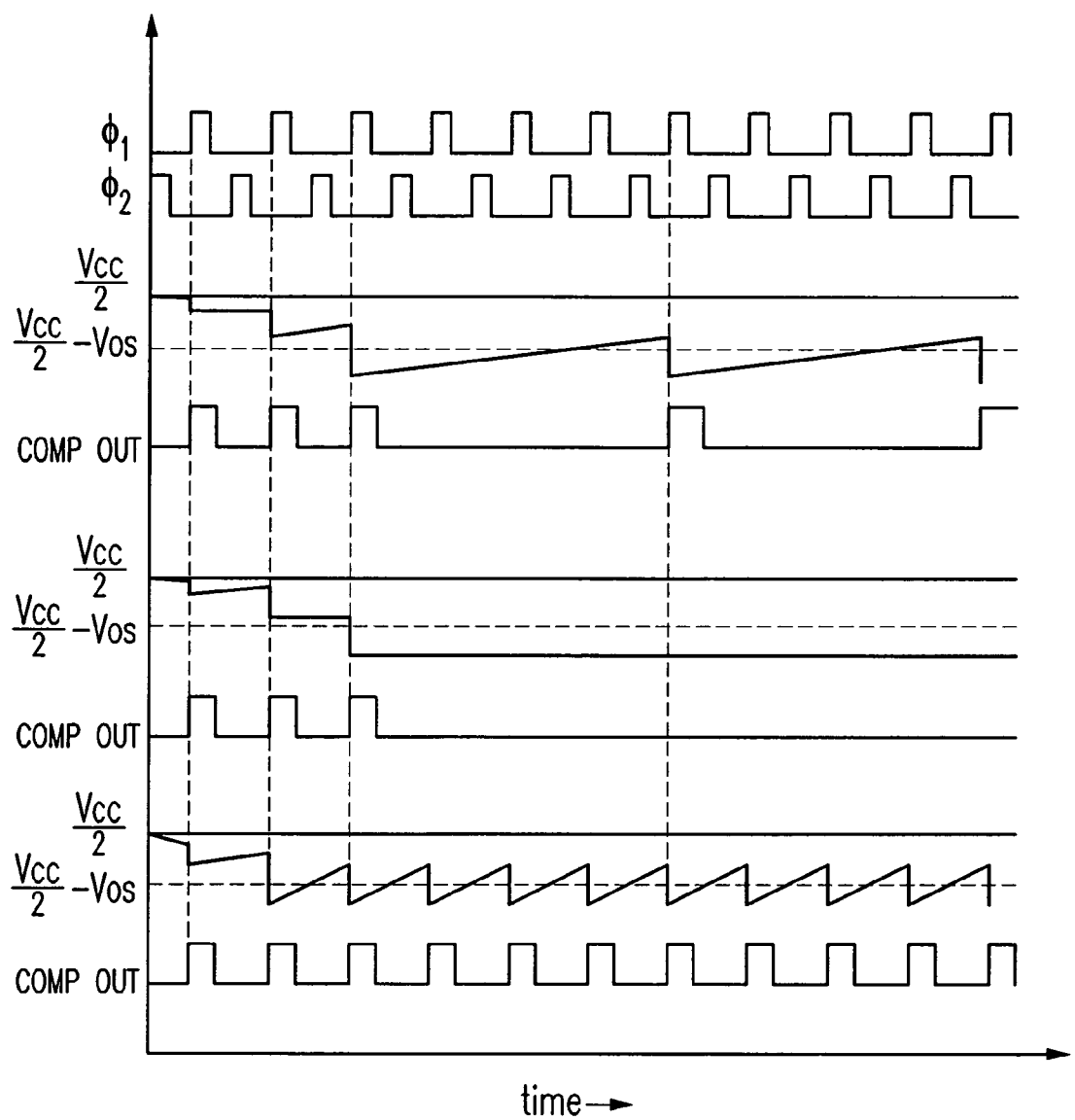
FIG. 3 is a set of timing diagrams for the operation of the integrated charge sensing circuit of FIG. 1.

FIG. 3 is a set of timing diagrams for the operation of the integrated charge sensing circuit of FIG. 1. $\Phi_1$ and $\Phi_2$ (shown in FIG. 3) are the two complementary and non-overlapping clock signals produced, for example, by the FIG. 2 circuit.

There are three distinct examples of the circuit operation depicted in FIG. 3. In the bottommost example, the resistance in the memory cell is small. In this instance, digit line 20b (bold line) is pulled quickly to $V_{cc}/2$ because there is very little resistance, which limits how fast digit line capacitor 75 charges. This causes comparator 40 output (COMP OUT) to go high frequently resulting in digit line capacitor 75 pulling digit line 20b low (towards ground). The comparator output (COMP OUT), therefore, mimics $\Phi_1$. If the resistance is very small, so low that digit line 20b can never be pulled below the $V_{cc}/2-V_{os}$ threshold, then the output of comparator 40 will go high every time the comparator is clocked. In this instance, the effect is to constantly pull charge from the bit line.

In the middle example, the resistance in the memory cell is very large. In this instance, digit line 20b is quickly pulled low to below $V_{cc}/2-V_{os}$. Because of the high resistance, the digit line charges very slowly back to $V_{cc}/2$, which causes comparator output (COMP OUT) to remain low most of the time.

In the topmost example, the resistance of the memory cell is in an intermediate range. Comparator 40 fires on the rising edge of $\Phi_1$ and a comparison is made between digit line 20b and $V_{cc}/2-V_{os}$. If digit line 20b voltage is greater than $V_{cc}/2-V_{os}$, the output of comparator 40 (COMP OUT) goes high. If digit line 20b voltage is less than $V_{cc}/2-V_{os}$) the output of comparator 40 (COMP OUT) remains low. The output of comparator 40 feeds clocked counter 65. Comparator 40 fires on the rising edge of $\Phi_1$ as indicated by the dotted lines at the rising edge of $\Phi_1$ on FIG. 3. That is, at the rising edge of the first three pulses of $\Phi_1$, a comparison is made and the digit line is greater than $V_{cc}/2-V_{os}$. At the rising edge of each $\Phi_1$ pulse, another comparison is made. After the first three COMPOUT pulses, and during the next three $\Phi_1$ pulses, the voltage at the first input of comparator 40 is lower than the reference $V_{cc}/2-V_{os}$ so the COMPOUT remains low during this period. Finally, on the seventh $\Phi_1$ pulse the bit line voltage on capacitor 75 is greater than the reference $V_{cc}/2-V_{os}$ and another pulse is produced at COMPOUT.

It is noted, in all instances, a comparator output of one/high allows the digit line capacitance 75 to discharge resulting in a voltage drop. The resistance of the memory cell then pulls the digit line voltage back up towards $V_{cc}/2$. In the bottommost example/trace, the voltage gets pulled back above $V_{cc}/2-V_{os}$ quickly. In the middle example/trace, the resistance is so great that it takes a very long time to pull the voltage up over the threshold level/value. In all examples, counter 65 counts on the leading edge of the COMPOUT pulses during the predetermined read period to register a value representing the resistance of memory cell 30.

Although FIG. 3 shows operation of the FIG. 1 circuit for three exemplary resistance values, in most digital circuits only two resistance states are stored in the memory cells.

Figure 4:
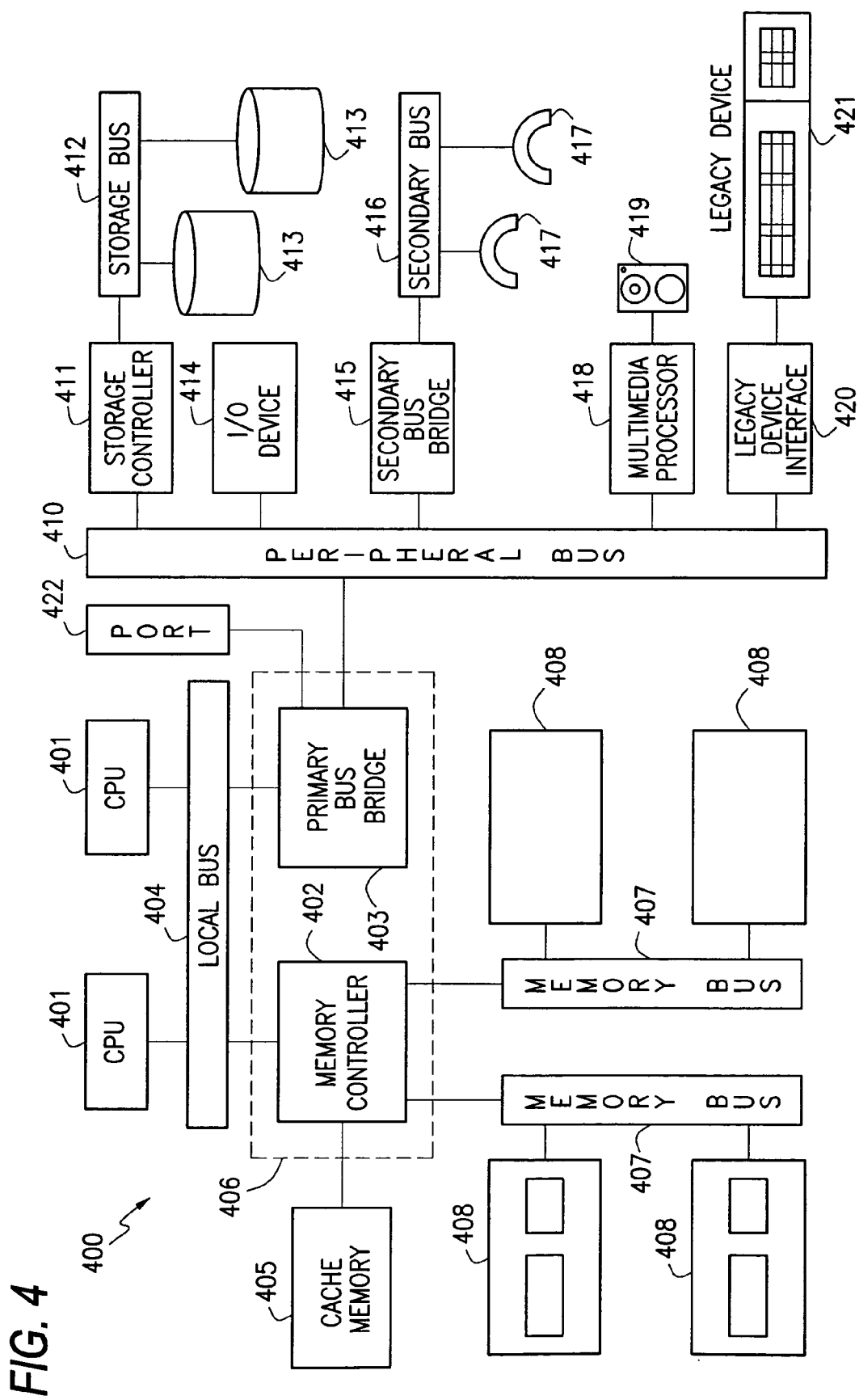
FIG. 4 is an exemplary computer system using resistive memory devices including the integrated charge sensing circuit of the present invention.

FIG. 4 illustrates an exemplary processing system 400 which uses a resistive memory device comprising an integrated charge sensing circuit in accordance with the embodiments of the present invention disclosed above in connection with FIGS. 1–3. The processing system 400 includes one or more processors 401 coupled to a local bus 404. A memory controller 402 and a primary bus bridge 403 are also coupled the local bus 404. The processing system 400 may include multiple memory controllers 402 and/or multiple primary bus bridges 403. The memory controller 402 and the primary bus bridge 403 may be integrated as a single device 406.

The memory controller 402 is also coupled to one or more memory buses 407. Each memory bus accepts circuits such as, a resistive memory device 408 which include at least one circuit using the integrated charge sensing circuit of the present invention. The resistive memory device 408 may be integrated with a memory card or a memory module and a CPU. Examples of memory modules include single inline memory modules (SIMMs) and dual inline memory modules (DIMMs). The memory controller 402 may also be coupled to a cache memory 405. The cache memory 405 may be the only cache memory in the processing system. Alternatively, other devices, for example, processors 401 may also include cache memories, which may form a cache hierarchy with cache memory 405. If the processing system 400 include peripherals or controllers which are bus masters or which support direct memory access (DMA), the memory controller 402 may implement a cache coherency protocol. If the memory controller 402 is coupled to a plurality of memory buses 407, each memory bus 407 may be operated in parallel, or different address ranges may be mapped to different memory buses 407.

The primary bus bridge 403 is coupled to at least one peripheral bus 410. Various devices, such as peripherals or additional bus bridges may be coupled to the peripheral bus 410. These devices may include a storage controller 411, a miscellaneous I/O device 414, a secondary bus bridge 415, a multimedia processor 418, and an legacy device interface 420. The primary bus bridge 403 may also coupled to one or more special purpose high speed ports 422. In a personal computer, for example, the special purpose port might be the Accelerated Graphics Port (AGP), used to couple a high performance video card to the processing system 400.

The storage controller 411 couples one or more storage devices 413, via a storage bus 412, to the peripheral bus 410. For example, the storage controller 411 may be a SCSI controller and storage devices 413 may be SCSI discs. The I/O device 414 may be any sort of peripheral. For example, the I/O device 414 may be an local area network interface, such as an Ethernet card. The secondary bus bridge 415 may be used to interface additional devices via another bus to the processing system. For example, the secondary bus bridge 415 may be an universal serial port (USB) controller used to couple USB devices 417 via to the processing system 400. The multimedia processor 418 may be a sound card, a video capture card, or any other type of media interface, which may also be coupled to one additional devices such as speakers 419. The legacy device interface 420 is used to couple legacy devices 421, for example, older styled keyboards and mice, to the processing system 400.

The processing system 400 illustrated in FIG. 4 is only an exemplary processing system with which the invention may be used. While FIG. 4 illustrates a processing architecture especially suitable for a general purpose computer, such as a personal computer or a workstation, it should be recognized that well known modifications can be made to configure the processing system 400 to become more suitable for use in a variety of applications. For example, many electronic devices which require processing may be implemented using a simpler architecture which relies on a CPU 401 coupled to resistive memory device 408 and/or memory buffer devices 404.

While the invention has been described and illustrated with reference to specific exemplary embodiments, it should be understood that many modifications and substitutions can be made without departing from the spirit and scope of the invention. Accordingly, the invention is not to be considered as limited by the foregoing description but is only limited by the scope of the appended claims.

What is claimed as new and desired by Letters Patent of the United States is:

1. A read circuit for reading a resistive memory cell, said circuit comprising:
    an access transistor for causing a current to pass through said memory cell to a digit line during a read operation;
    a first capacitor coupled to said digit line for charging up a voltage on said digit line in response to said current;
    a clocked comparator having a first input coupled to said digit line and a second input for receiving a reference voltage, said comparator making a comparison of voltage levels at said first and second inputs in response to a first state of a first clock signal and providing a first output state if said digit line voltage is greater than said reference voltage and a second output state if said reference voltage is greater than said digit line voltage;
    a second capacitor;
    a first switch element responsive to said first state of said comparator for coupling said second capacitor to said digit line to reduce the voltage on said digit line and being responsive to said second state of said comparator for uncoupling said second capacitor from said digit line; and
    a second switch element for operating at a time when said second capacitor is not connected to said digit line for discharging said second capacitor.

2. The read circuit of claim 1 wherein said second switch element is controlled by the output state of said comparator.

3. The read circuit of claim 1 wherein said second switch element is controlled by a first state of a second clock signal, said second clock signal having pulses which are interleaved in time with respect to pulses of said first clock signal.

* * * * *

UNITED STATES PATENT AND TRADEMARK OFFICE
CERTIFICATE OF CORRECTION

PATENT NO. : 7,151,698 B2
APPLICATION NO. : 11/106716
DATED : December 19, 2006
INVENTOR(S) : R. Jacob Baker It is certified that error appears in the above-identified patent and that said Letters Patent is hereby corrected as shown below:

In the Specification, the following errors are corrected:

Column 4, line 65, "coupled the" should read --coupled to the--.

Column 5:

Line 5, "as, a" should read --as a--;

Line 5, "include" should read --includes--;

Line 14, "401" should read --401,--;

Line 16, "include" should read --includes--;

Line 29, "an legacy" should read --a legacy--;

Line 30, "also coupled" should read --also be coupled--;

Line 40, "an local" should read --a local--;

Line 44, "an universal" should read --a universal--;

Line 45, "via to the" should read --via the--; and

Line 48, "to one additional" should read --to additional--.

Signed and Sealed this

Twentieth Day of March, 2007

JON W. DUDAS
*Director of the United States Patent and Trademark Office*